(12) United States Patent
Takahashi

(10) Patent No.: US 9,355,714 B2
(45) Date of Patent: May 31, 2016

(54) NONVOLATILE SEMICONDUCTOR MEMORY DEVICE AND METHOD OF CONTROLLING THE SAME

(71) Applicant: KABUSHIKI KAISHA TOSHIBA, Minato-ku (JP)

(72) Inventor: Eietsu Takahashi, Yokkaichi (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 14/638,584

(22) Filed: Mar. 4, 2015

(65) Prior Publication Data

US 2016/0071580 A1    Mar. 10, 2016

Related U.S. Application Data

(60) Provisional application No. 62/048,642, filed on Sep. 10, 2014.

(51) Int. Cl.
*G11C 16/34* (2006.01)
*G11C 11/56* (2006.01)

(52) U.S. Cl.
CPC ........ G11C 11/5628 (2013.01); G11C 11/5642 (2013.01); *G11C 16/3436* (2013.01); *G11C 16/3454* (2013.01); *G11C 16/3481* (2013.01)

(58) Field of Classification Search
CPC .......... G11C 16/3436; G11C 16/3454; G11C 16/3481; G11C 11/5628; G11C 11/5642
USPC ............. 365/185.03, 185.17, 185.18, 185.22, 365/185.29
See application file for complete search history.

(56) References Cited

U.S. PATENT DOCUMENTS

| | | | |
|---|---|---|---|
| 7,616,496 B2 | 11/2009 | Choi et al. | |
| 8,081,513 B2 | 12/2011 | Fukuda | |
| 2009/0168510 A1* | 7/2009 | Lee | G11C 16/10 365/185.2 |
| 2011/0305089 A1* | 12/2011 | Abe | G11C 11/5642 365/185.17 |
| 2012/0275223 A1 | 11/2012 | Baek | |

FOREIGN PATENT DOCUMENTS

| | | |
|---|---|---|
| JP | 2008-226421 A | 9/2008 |
| JP | 2009-266356 A | 11/2009 |
| JP | 2012-230753 A | 11/2012 |

* cited by examiner

*Primary Examiner* — Tan T. Nguyen
(74) *Attorney, Agent, or Firm* — Oblon, McClelland, Maier & Neustadt, L.L.P.

(57) ABSTRACT

A semiconductor memory device comprises: a memory cell array comprising memory cells, each memory cell being able to store multi-bit data; word-lines connected to the memory cells, the word-lines being arranged in a first direction; bit-lines arranged in a second direction crossing the first direction, the bit-lines reading data from the memory cell array; and a control circuit controlling the operation of the memory cell array. The control circuit performs a first write operation of applying a first write voltage between a selected word-line and a channel of a selected memory cell, then performs a verify operation of determining whether the first write operation is completed, and performs a second write operation of applying, if the write operation to the first threshold voltage is completed in the verify operation, a second write voltage lower than the first write voltage between the selected word-line and the channel.

17 Claims, 17 Drawing Sheets

NONVOLATILE SEMICONDUCTOR MEMORY DEVICE AND METHOD OF CONTROLLING THE SAME

CROSS REFERENCE TO RELATED APPLICATIONS

This application is based on and claims the benefit of priority from prior U.S. prior provisional Patent Application No. 62/048,642, filed on Sep. 10, 2014, the entire contents of which are incorporated herein by reference.

BACKGROUND

1. Field

The embodiments described in the present specification relate to a semiconductor memory device and a method of controlling the same.

2. Description of the Related Art

A non-volatile semiconductor memory device such as a NAND flash memory comprises a memory cell. The memory cell comprises a control gate and a charge accumulation layer. The charge accumulated in the charge accumulation layer changes the threshold voltage of the memory cell. The amount of the threshold voltage is stored as data by the non-volatile semiconductor memory device. In such a semiconductor memory device, the threshold voltage may be dropped over time.

DETAILED DESCRIPTION

A semiconductor memory device according to an embodiment comprises: a memory cell array comprising memory cells, each memory cell being able to store multi-bit data; word-lines connected to the memory cells, the word-lines being arranged in a first direction; bit-lines arranged in a second direction crossing the first direction, the bit-lines reading data from the memory cell array; and a control circuit controlling the operation of the memory cell array. The control circuit performs a first write operation of applying a first write voltage between a selected word-line and a channel of a selected memory cell, then performs a verify operation of determining whether the first write operation is completed, and performs a second write operation of applying, if the write operation to the first threshold voltage is completed in the verify operation, a second write voltage lower than the first write voltage between the selected word-line and the channel.

A method of controlling a semiconductor memory device according to an embodiment is provided, the semiconductor memory device comprising: a memory cell array comprising memory cells, each memory cell being able to store multi-bit data; word-lines connected to the memory cells, the word-lines being arranged in a first direction; bit-lines arranged in a second direction crossing the first direction, the bit-lines reading data from the memory cell array; and a control circuit controlling the operation of the memory cell array. The method comprises: performing a first write operation of applying a first write voltage between a selected word-line and a channel of a selected memory cell; then performing a verify operation of determining whether the first write operation is completed; and performing, if the the write operation to the first threshold voltage is completed in the verify operation, a second write operation applying a second write voltage lower than the first write voltage between the selected word-line and the channel.

Next, the semiconductor memory device according to the embodiments will be described in more detail with reference to the drawings.

First Embodiment (Entire Configuration)

Figure 1:
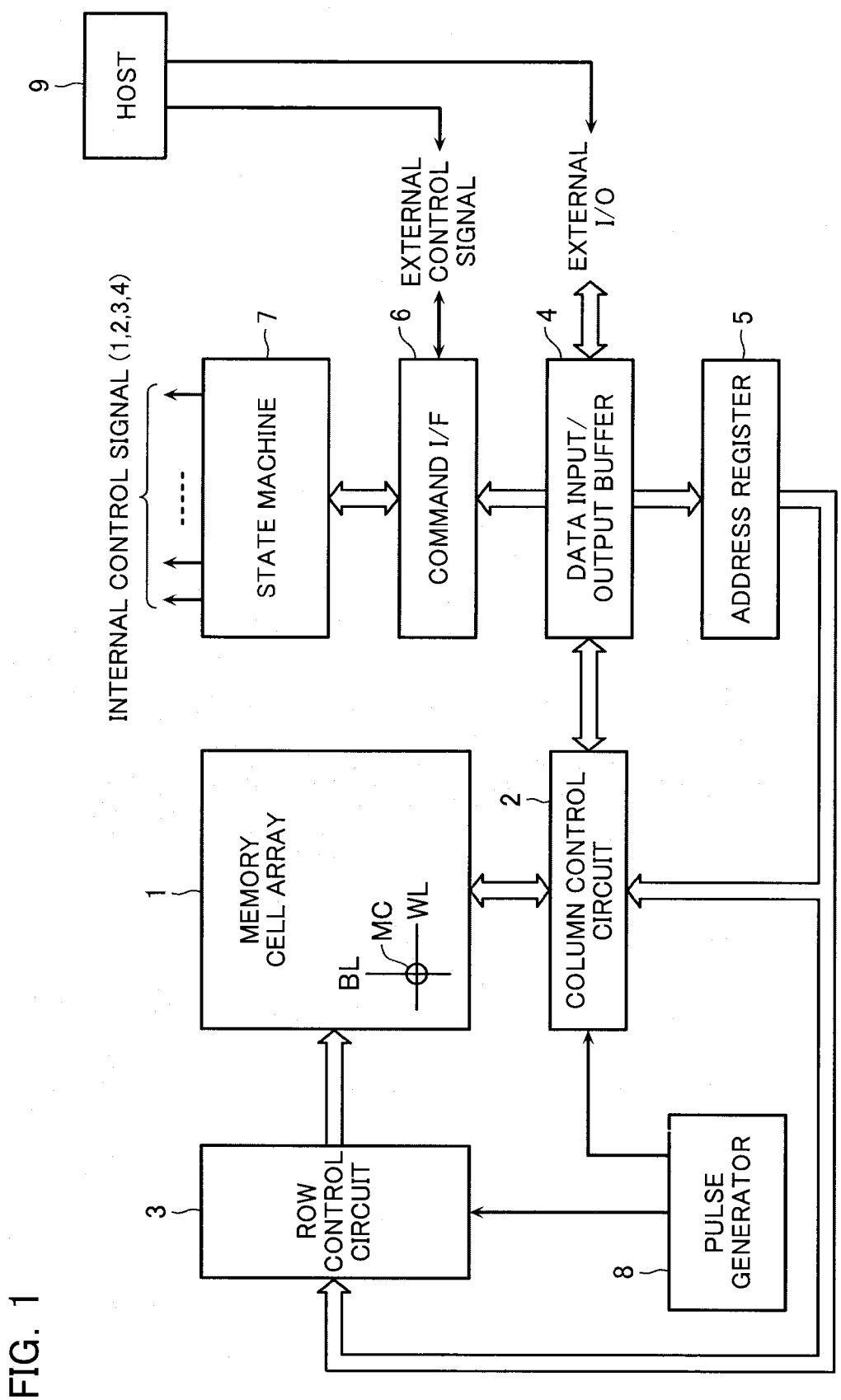
FIG. 1 is an entire block diagram of a semiconductor memory device according to a first embodiment.

FIG. 1 is a block diagram showing the configuration of a non-volatile semiconductor memory device according to a first embodiment. The semiconductor memory device is a NAND flash memory that uses a four-level storage scheme.

The semiconductor memory device in the first embodiment comprises a memory cell array 1. The memory cell array 1 comprises a plurality of memory cells MC disposed in a matrix, the memory cells storing data. The memory cell array 1 comprises a plurality of bit-lines BL and a plurality of word-lines WL. The bit-lines BL and the word-lines WL are crossing each other. The intersections of the bit-lines BL and the word-lines WL have respective memory cells MC disposed therein. Each memory cell MC comprises a stack structure of a floating gate electrode that functions as a charge accumulation layer for accumulating charge and a control gate electrode connected to one of the word-lines WL. Injection or discharge of charge from the floating gate electrode may electrically rewrite data.

The memory cell array 1 is connected to a column control circuit 2 for controlling the voltage of the bit-lines BL and a row control circuit 3 for controlling the voltage of the word-lines WL. The column control circuit 2 reads data via the bit-lines BL from the memory cells MC and writes data via the bit-lines BL to the memory cells MC. The row control circuit applies, via the word-lines WL, voltages for data write/read/erase to the gate electrodes of the memory cells MC. In this embodiment, the column control circuit 2 and the row control circuit 3 are an example of a control circuit controlling the writing to the memory cell array 1.

The column control circuit 2 is connected to a data input/output buffer 4. Data of a memory cell MC read by the column control circuit 2 is outputted via the data input/output buffer 4 through a data input/output terminal (external I/O) to the external host 9. In addition, write data inputted from the external host 9 to the data input/output terminal (external I/O) is inputted via the data input/output buffer 4 to the column control circuit 2 and written to a specified memory cell MC.

The data input/output buffer 4 is connected to an address register 5 and a command I/F 6. The address register 5 outputs address information inputted from the data input/output buffer 4 to the column control circuit 2 and the row control circuit 3. The command I/F 6 is connected to a state machine 7 and the external host 9 and transmits and receives a control signal between these blocks. The state machine 7 is connected to the memory cell array 1, the column control circuit 2, the row control circuit 3, and the data input/output buffer 4. The state machine 7 generates, according to an external control signal inputted from the host 9 via the command I/F 6, an internal control signal to control the memory cell array 1, the column control circuit 2, the row control circuit 3, and the data input/output buffer 4.

(Configuration of Memory Cell Array)

Figure 2:
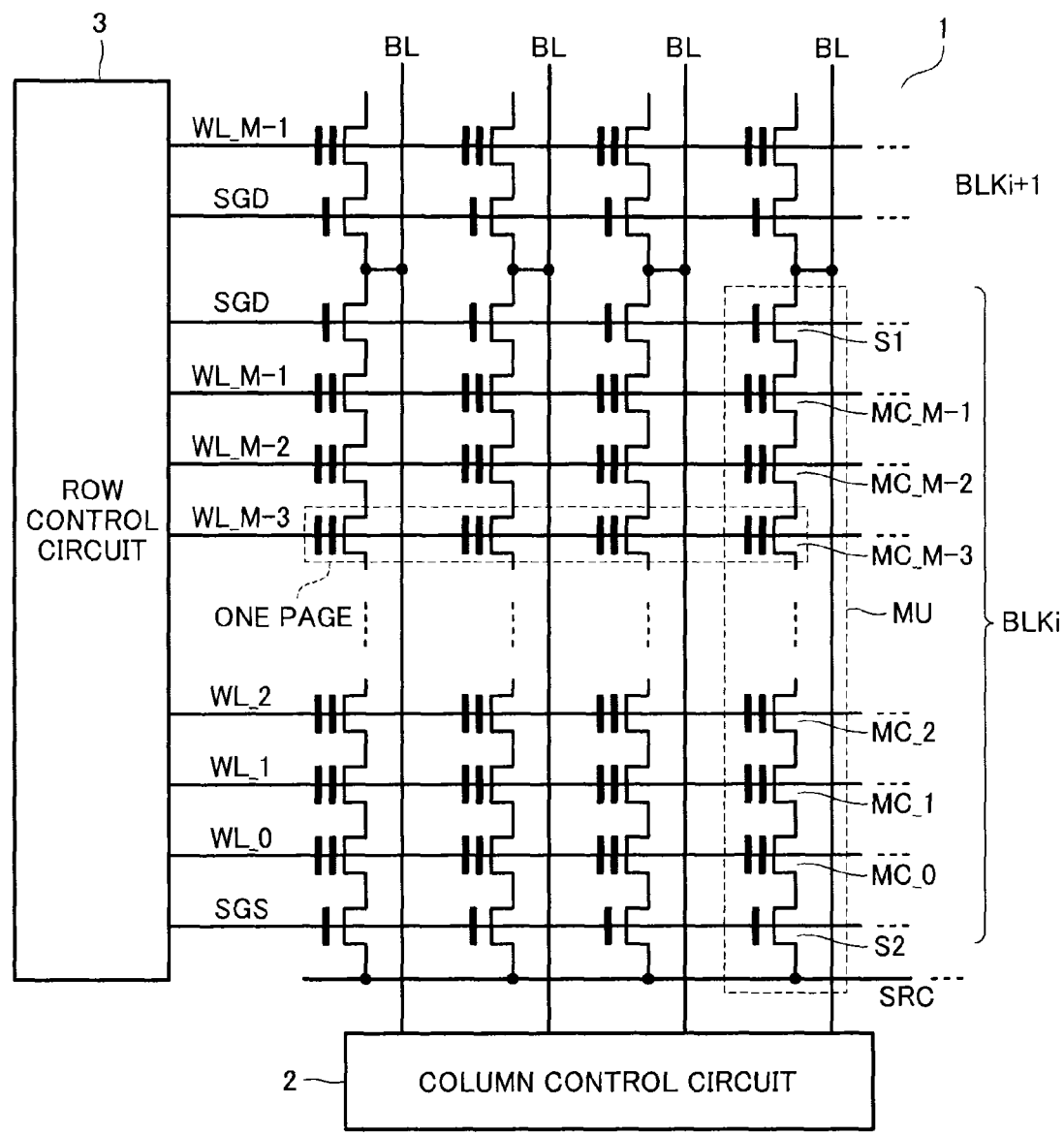
FIG. 2 is a circuit diagram showing the detailed configuration of a memory cell array.

FIG. 2 is a circuit diagram showing the configuration of a portion of the memory cell array 1 shown in FIG. 1. The memory cell array 1 comprises a plurality of memory units MU. Each memory unit MU comprises M (for example, M=16) memory cells MC_0 to MC_M−1 connected in series and a first select gate transistor S1 and a second select gate transistor S2 connected to the opposite ends of the memory unit MU. The first select gate transistor S1 has one end connected to one of the bit-lines BL. The second select gate transistor S2 has one end connected to a source-line SRC. In other words, in the cross regions of the word-lines WL and the bit-lines BL, the memory cell MC are arranged in series and sandwiched by the select transistors (S1 and S2).

Figure 3:
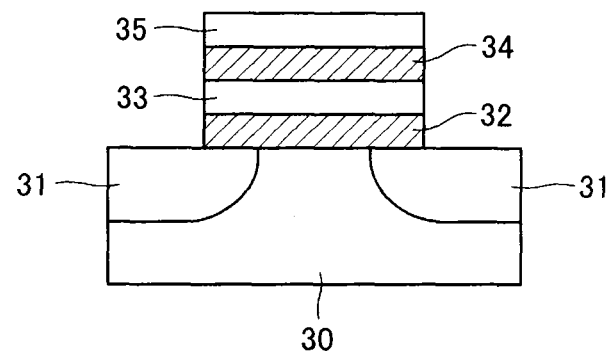
FIG. 3 is a cross-section schematic diagram showing the configuration of a memory cell.

FIG. 3 shows the configuration of each memory cell MC. Each memory cell MC comprises, for example, a channel region 30 and two source/drain regions 31 formed at the opposite ends thereof. The channel region 30 has a surface sandwiched between the two source/drain regions 31. The surface has thereon a stack of, sequentially from the channel region 30 side, a tunnel insulating film 32, a floating gate electrode 33, an inter-gate dielectric film 34, and a control gate electrode 35.

Returning to FIG. 2, the control gate electrodes 35 of the memory cells MC_0 to MC_M−1 are connected to respective word-lines WL_0 to WL_M−1. More than one memory unit MU is disposed in the direction in which the word-lines WL extend and forms one block BLKi. The memory cell array 1 erases data in units of the block BLK. In addition, one word-line WL is commonly connected to more than one memory cell MC that forms one page. The memory cell array 1 writes and reads data in units of the page.

(Data Storage Scheme)

Next, the data storage scheme of the non-volatile semiconductor memory device is schematically described. The non-volatile semiconductor memory device according to this embodiment is configured such that the threshold voltage of each memory cell MC may have four types of distributions (E, A, B, and C).

Figure 4:
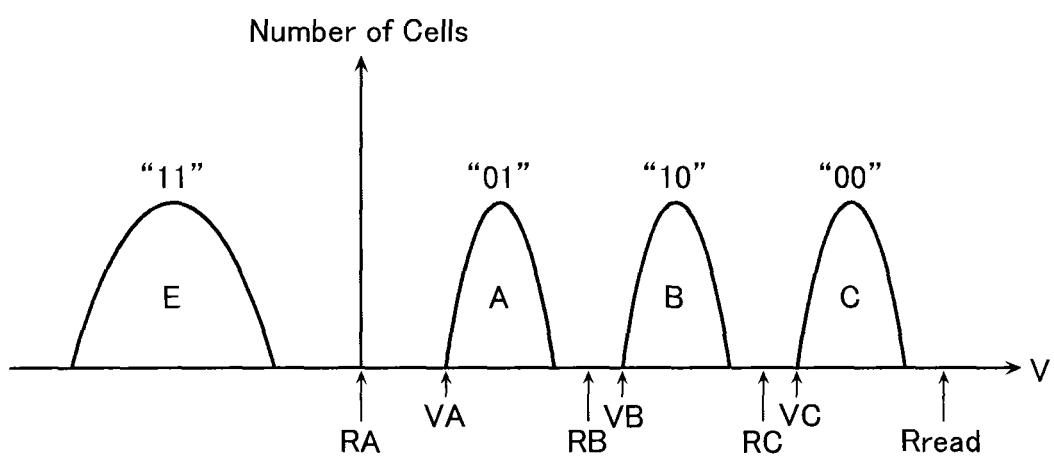
FIG. 4 is a graph showing distributions of the threshold voltages of memory cells in data writing.

FIG. 4 is a schematic diagram showing the threshold voltages of the memory cell in data writing. The y-axis in the graph shows the number of memory cells and the x-axis in the graph shows the threshold voltages of the memory cell. Four-level data is defined by, for example, the negative threshold voltage distribution (erase distribution) E at the lowest voltage level and the threshold voltage distributions A, B, and C at a higher voltage level. This embodiment assumes that the threshold voltage distributions E, A, B, and C, correspond to respective data "11", "01", "10", and "00".

In the data write operation, the selected word-line connected to one page memory cells MC to be written is provided with a write voltage VPGM (for example, about 20 to 28 V), and the other non-selected word-lines with a write pass voltage Vpass (for example, about 8 to 10 V). Then, the bit-lines electrically connected to the memory cells MC to be written are selectively provided with a ground voltage Vss or a power supply voltage Vdd. The ground voltage Vss is provided in "0" writing that raises the threshold voltage. The power supply voltage Vdd is provided in "1" writing that does not raise the threshold voltage. This selectively injects electrons into the floating gate of each memory cell MC. Note that in the following description, the power supply voltage Vdd may be referred to as a "boost voltage (Boost)".

In the "0" writing that raises the threshold voltage, the bit-lines are provided with the ground voltage Vss that is transferred to the channels of the NAND cell units via the first select gate transistors S1 rendered conductive. Thus, if the write voltage VPGM is provided, the channel-floating gates conducts a tunneling current, which injects electrons into the floating gates.

Meanwhile, in the "1" writing (write inhibit) that does not raise the threshold voltage, the bit-lines BL are provided with the power supply voltage Vdd. Even if in this condition the first select gate transistors S1 are provided with the power supply voltage Vdd, the channels of the NAND cell units are charged to Vdd−Vt (Vt is the threshold voltage of the first select gate transistor S1) and floated. Thus, if the write voltage VPGM is provided, the cell channels are boosted by the capacitive coupling, thus injecting no electrons into the floating gates.

In the data read operation, the gate-sources (or channels) of the selected memory cells MCs to be read are applied with a read voltage RA, RB, or RC. The read voltage RA is between the upper limit of the threshold voltage distribution E and the lower limit of the threshold voltage distribution A, the voltage RB is between the distribution A upper limit and the distribution B lower limit, and the voltage RC is between the distribution B upper limit and the distribution C lower limit (see FIG. 4). In addition, the gate-sources (or channels) of the non-selected memory cells that are not to be read is applied with a read-pass voltage Vread higher than the upper limit of the threshold voltage distribution C. The read-pass voltage Vread is a voltage that has a larger value than the upper limit of the threshold voltage distribution C. The voltage Vread may render the memory cell MC conductive regardless of data held in the memory cell MC.

A verify operation is performed generally similarly to the read operation. Note, however, that verify voltages VA, VB, and VC are applied to the selected word-line that are higher than the above read voltages RA, RB, and RC, respectively. [0022].

As described above, the threshold voltage distribution of the memory cell MC that has completed the write operation is finally one of E, A, B, and C (see FIG. 4). These threshold voltage distributions correspond to the respective data "11(E)", "01(A)", "10(B)", and "00(C)" as described above. Thus one memory cell MC may store four-level data.

Figure 5:
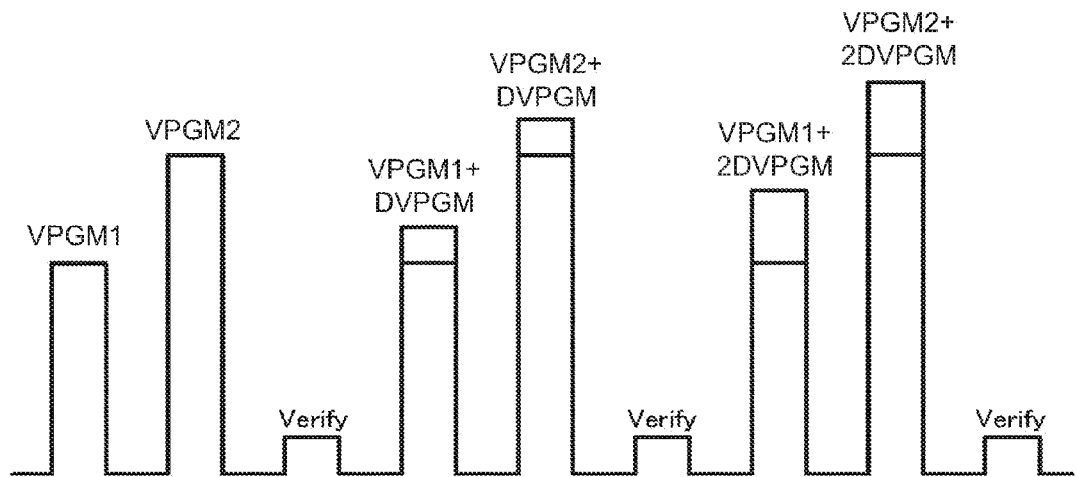
FIG. 5 is a waveform chart showing a write voltage in data writing.

FIG. 5 is a waveform chart showing the write voltage applied to the word-line in data writing. This embodiment comprises two voltages of a first write voltage for writing the high threshold voltage distribution (C) and a second write voltage for writing the threshold voltage distributions (A and B) lower than the threshold voltage distribution (C). In addition, among the voltages for generating the first and second write voltages in the memory cells, the voltages applied to the word-line are referred to as a first word-line voltage VPGM1 and a second word-line voltage VPGM2, respectively. Note, however, that if the memory cell's channel voltage is Vss(=0 V), the voltage applied between the selected word-line and the channels of the memory cells equals one of the first and second word-line voltages VPGM1 and VPGM2. In this case, the first and second write voltages are referred to as the first and second write voltages VPGM1 and VPGM2, respectively. The second word-line voltage VPGM1 is set lower than the value of the first word-line voltage VPGM2. In the write operation in this embodiment, as shown in FIG. 5, at first the word-line WL is applied with the second word-line voltage VPGM2, then the word-line WL is applied with the first word-line voltage VPGM1, and finally the word-line WL is applied with a verify voltage Verify. Such application forms one cycle. Note that the order in which the above three types of voltages are applied is not limited to the above.

In addition, this embodiment comprises a step-up scheme in which if the memory cell MC does not pass the verify operation (an operation to determine whether the write operation to the desired threshold voltage is completed), the value of the write voltage is increased and the writing is performed again. Therefore, even in FIG. 5, the first and second word-line voltages VPGM1 and VPGM2 are each increased in the 2nd cycle by dVPGM compared to the 1st cycle, and increased in the 3rd cycle by 2dVPGM compared to the 1st cycle.

(Problems in Data Write)

Here, even in the memory cell MC that has once passed the verify and completed the write, the trapped electrons may leak from the floating gate or the periphery thereof over time, which may reduce the threshold voltage of the memory cell and change the held data. This point will be described below with reference to FIG. 6 to FIG. 10.

Figure 6:
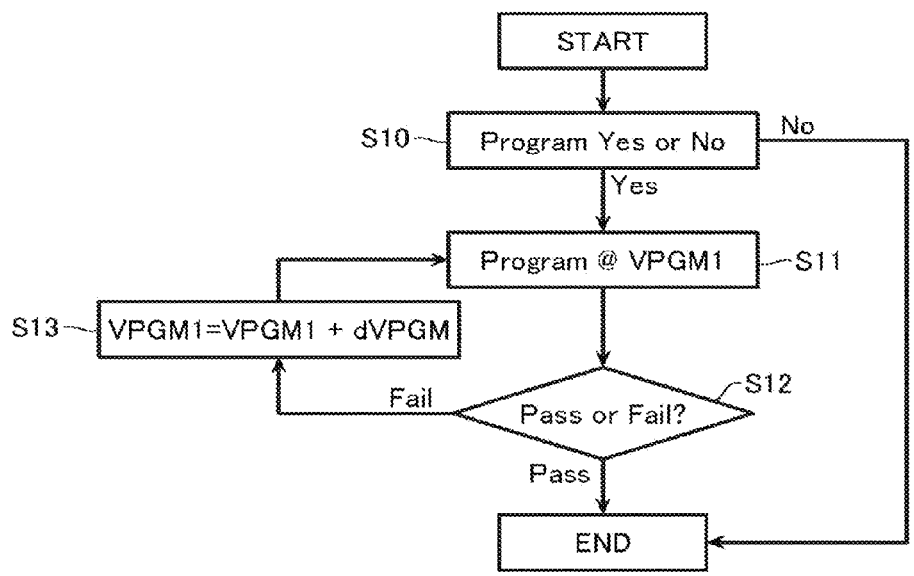
FIG. 6 is a flowchart showing a data write operation of a semiconductor memory device according to a first comparative embodiment.

FIG. 6 is a flowchart showing the data write operation of a semiconductor memory device according to a first comparative embodiment. Here, a description is given of the memory cell MC written with "00" data that provides the highest threshold voltage distribution (C).

First, the control circuit comprising the column control circuit 2 and the row control circuit 3 (see FIG. 1 for both) determines whether to perform the data write operation (program operation) (step S10). If step S10 determines "NO", then the write operation is completed.

If step S10 determines "YES", then the control circuit applies to the memory cell the first write voltage VPGM1 for writing the high voltage threshold distribution (C) corresponding to "00" data (step S11). Then, the control circuit performs a verify operation of determining whether the write operation is completed (step S12). If step S12 determines that the write operation is completed (step S12=Pass), then the control circuit completes the write operation. If step S12 does not determine that the write operation is completed (step S12=Fail), then the control circuit steps up the value of the first write voltage VPGM1 (step S13) and performs again the write operation in step S11. The new write voltage is, as shown in step S13, VPGM1=VPGM1+dVPGM.

Figure 7:
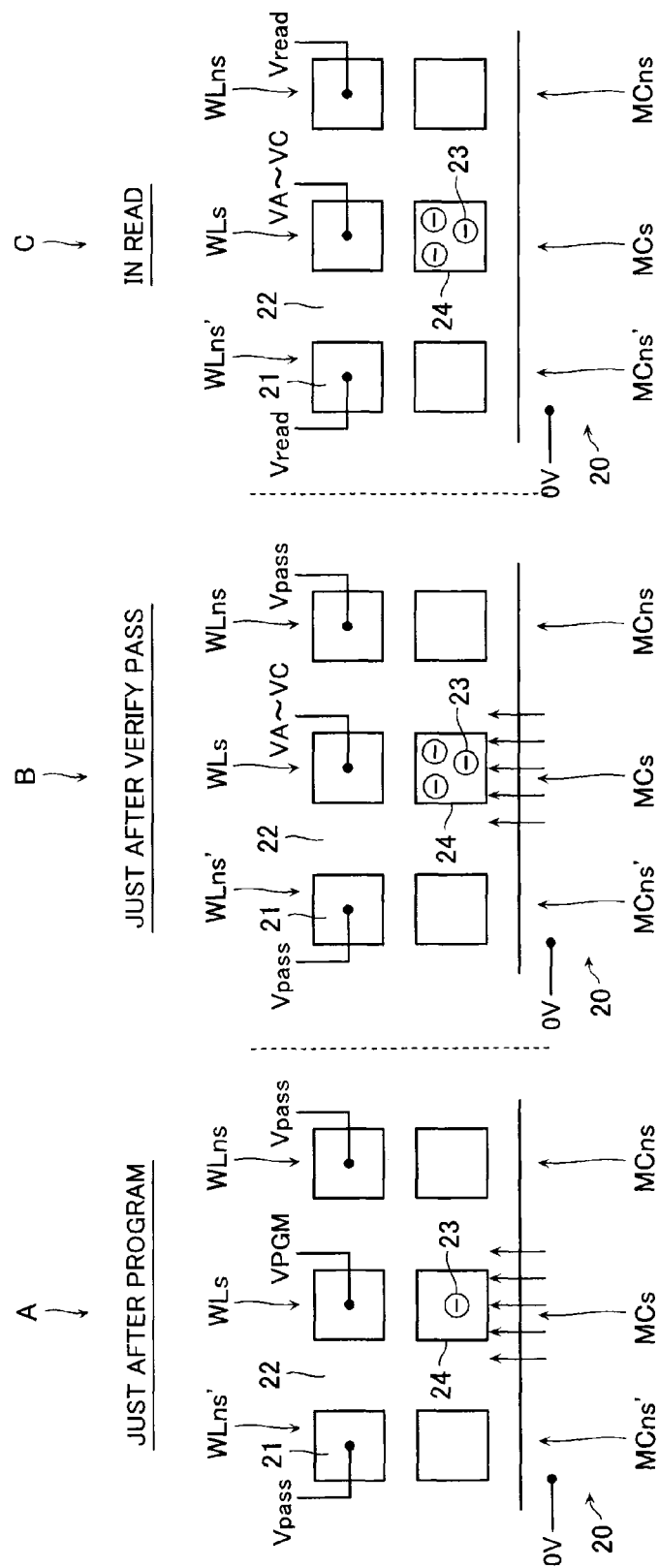
FIG. 7 is a schematic diagram (part one) showing memory cells in writing data to the semiconductor memory device according to the first comparative embodiment.

FIG. 7 is a schematic diagram of the behavior of charges in the normal write operation. Among the statuses shown in FIG. 7, the status A corresponds to the write operation (program), the status B corresponds to the verify operation, and the status C corresponds to the read operation. FIG. 7 shows, among the components of the memory cell, only a channel region 20, a control gate 21, an insulating film 22 (including a tunnel insulating film and a gate-insulating film), and a floating gate 24. In addition, among the memory cells, the selected memory cell to be written is denoted by MCs, and the other non-selected memory cells are denoted by MCns and MCns'. In addition, the selected word-line connected to the selected memory cell MCs is denoted by WLs and the non-selected word-lines connected to the other memory cells (MCns and MCns') are denoted by WLns and WLns', respectively.

As shown in the status A in FIG. 7, in the normal write operation, the selected word-line WLs is applied with the first word-line voltage VPGM1 (for example, about 20 V), while the non-selected word-lines WLns and WLns' are applied with the write pass voltage Vpass (for example, about 8 V). In addition, the voltage of the channel region 20 is set to, for example, 0 V. Thus, the selected memory cell MCs connected to the selected word-line WLs is applied with the first write voltage VPGM1, which injects charge 23 into the floating gate 24.

If the write operation in the status A in FIG. 7 is repeated until a predetermined amount or more of charge 23 is injected into the floating gate 24, the threshold voltage of the selected memory cell MCs reaches a predetermined verify level. It is thus determined that the write operation is completed (see the status B in FIG. 7). Then, the selected memory cell MCs is applied with the verify voltage VC (see FIG. 4) for determining the completion of the write operation to the C distribution.

If the write operation is completed normally, a small amount of charge is changed over time, and thus the subsequent read operation (see the status C in FIG. 7) has a small possibility of misreading. Note that in the read operation, the selected memory cell MCs is applied with the read voltages RA to RC (see FIG. 4) and the non-selected memory cells MCns and MCns' are applied with the read-pass voltage Vread.

Figure 8:
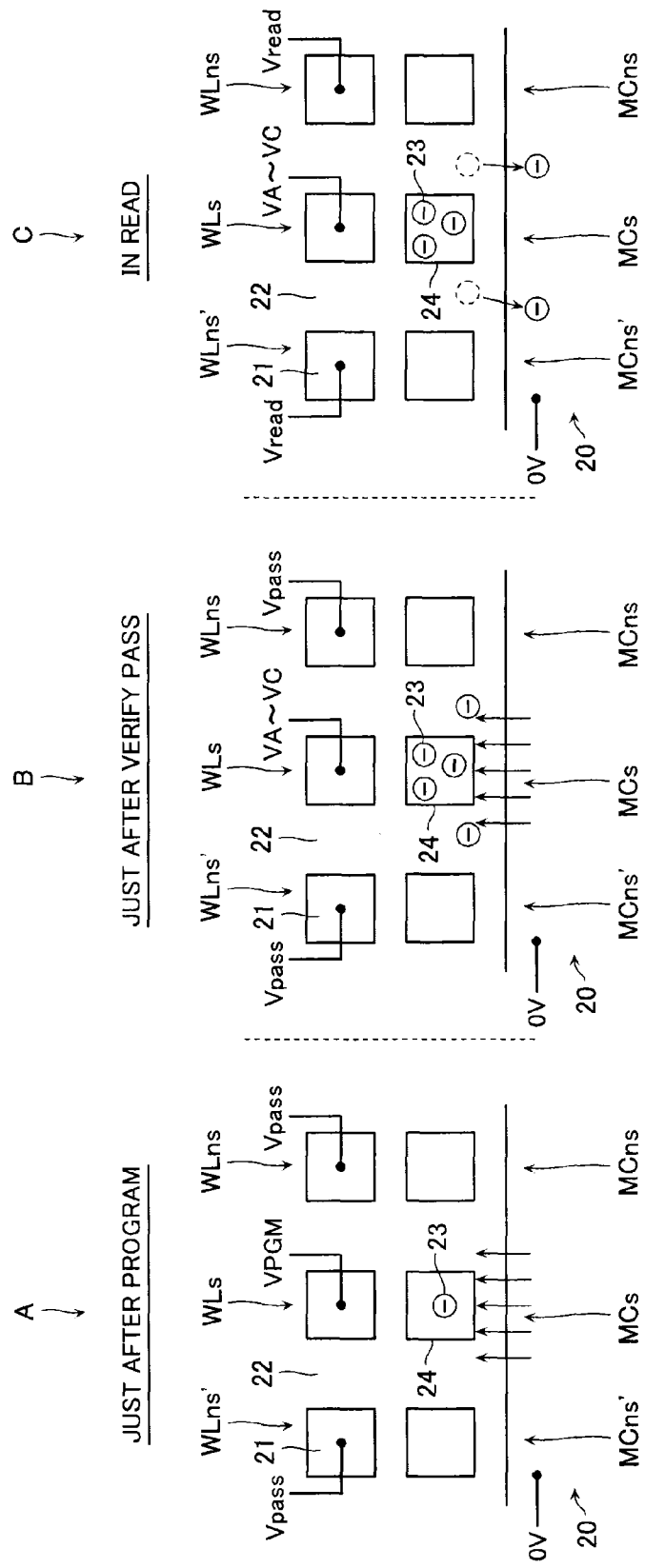
FIG. 8 is a schematic diagram (part two) showing memory cells in writing data to the semiconductor memory device according to the first comparative embodiment.

FIG. 8 is a schematic diagram of the behavior of charges if the normal write operation is not performed. The statuses A to C in FIG. 8 correspond to the respective statuses A to C in FIG. 7. The behavior of charges in the write operation in the status A is similar to that in the normal write operation (status A in FIG. 7). Thus its description is omitted here.

Here, because the memory cell becomes more compact or for other reasons, instead of the floating gate 24 of the selected memory cell MCs, the insulating film 22 (an interlayer dielectric film, a tunnel insulating film, or the like) positioned near the floating gate 24 may trap charge 23 (see the status B in FIG. 8). Even such a condition may allow the verify operation to determine that the threshold voltage of the selected memory cell MCs exceeds a predetermined verify level (VC).

However, because the insulating film 22 has a smaller charge storage capacity than the floating gate 24, charge stored in the insulating film 22 outside the floating gate 24 is easily leaked out (detrapped). Therefore, the threshold voltage of the selected memory cell MCs is reduced, which causes garbled data in the selected memory cell MCs.

Figure 9:
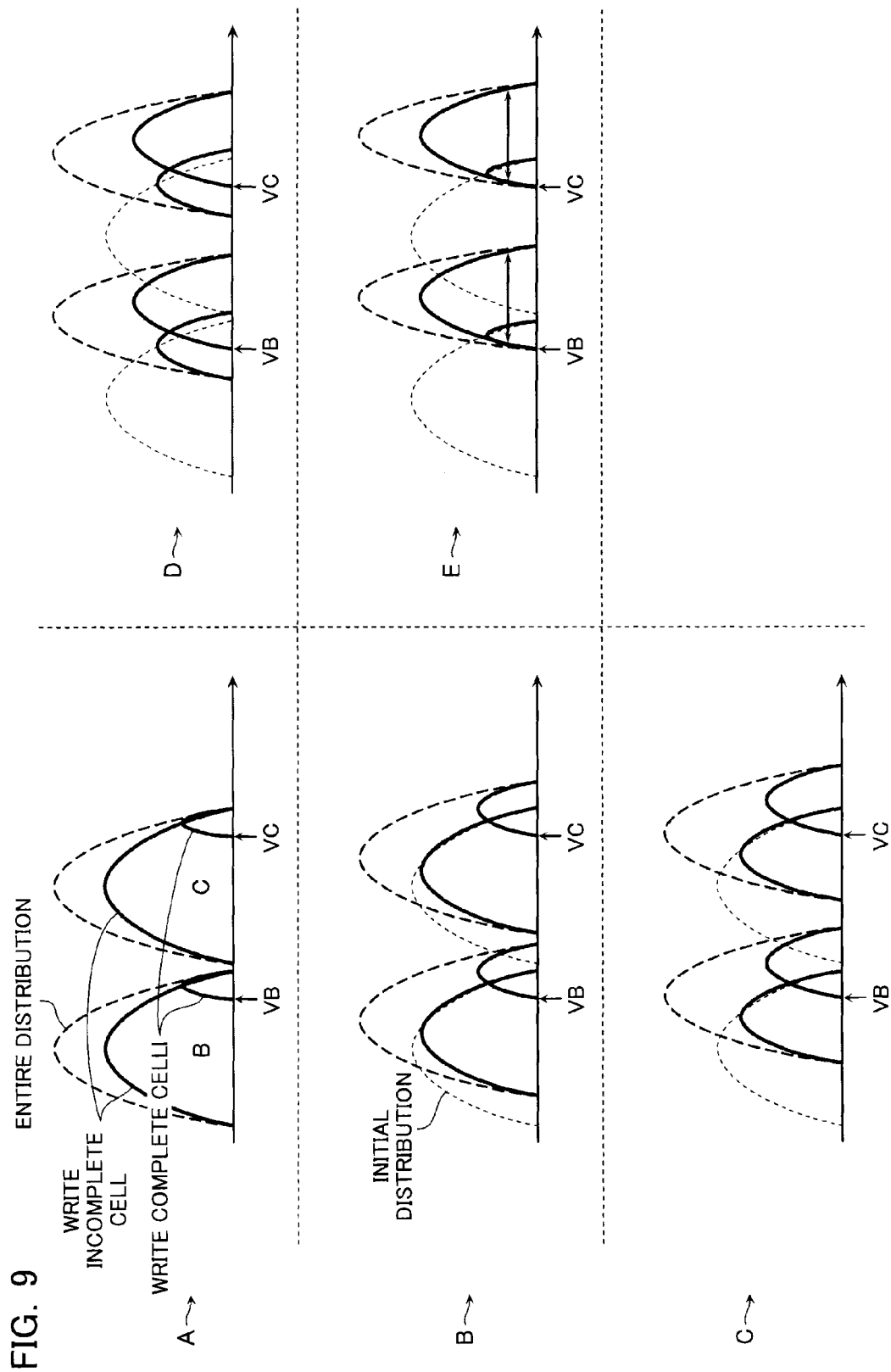
FIG. 9 is a graph (part one) showing a change of the threshold voltage distributions of the memory cells in writing data to the semiconductor memory device according to the first comparative embodiment.
Figure 10:
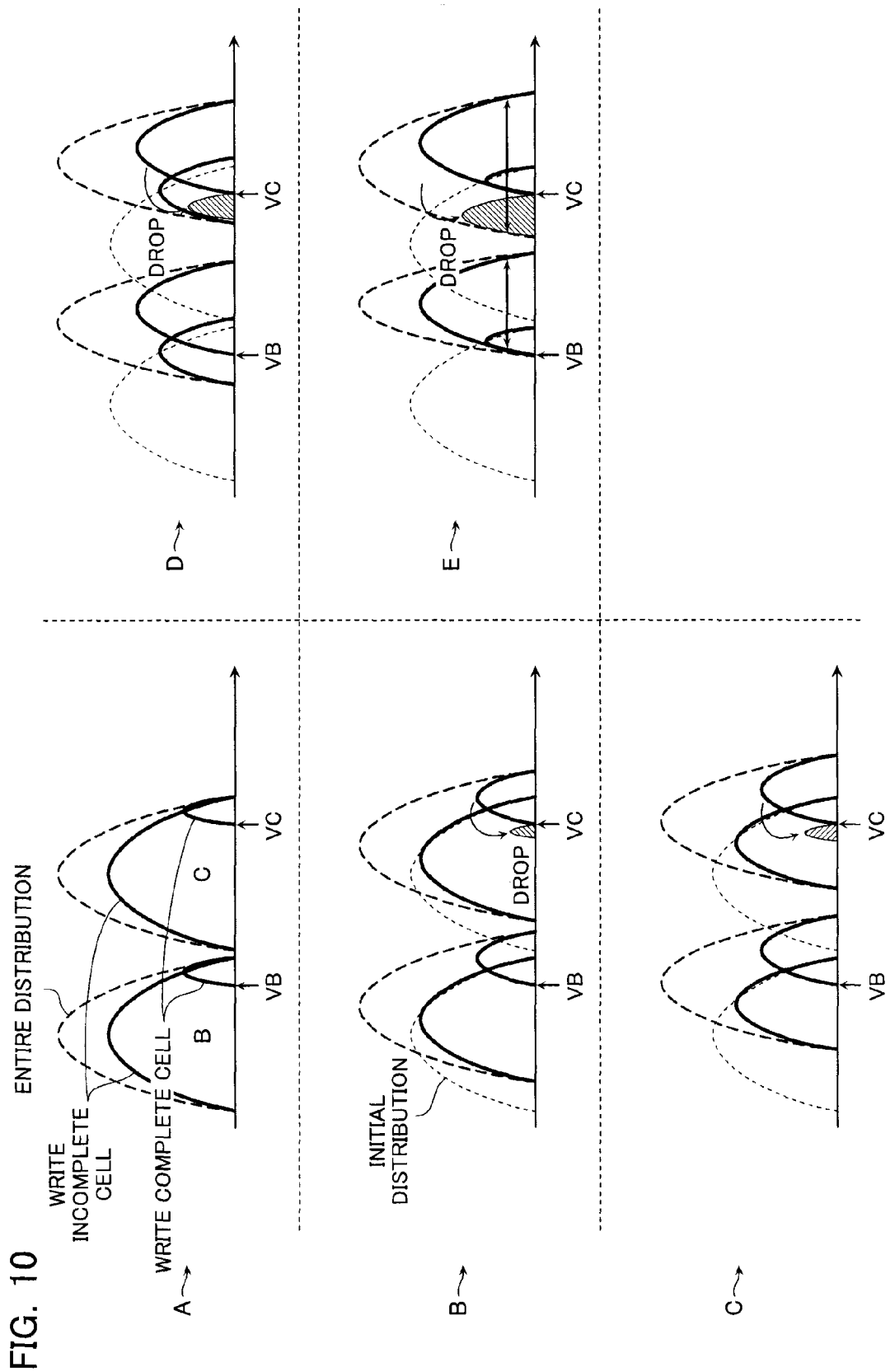
FIG. 10 is a graph (part two) of a change of the threshold voltage distributions of the memory cells in writing data to the semiconductor memory device according to the first comparative embodiment.

FIG. 9 and FIG. 10 show the change of the threshold voltage distributions of the memory cells in the data write operation. FIG. 9 shows the change in the normal write operation corresponding to FIG. 7. FIG. 10 shows the change in the abnormal write operation corresponding to FIG. 8. The status A in the figures shows the state in which the write operation starts. The status E shows the state in which the write operation is completed. It is assumed that the write operation proceeds in the order of A→B→C→D→E. In addition, FIG. 9 and FIG. 10 show the distributions of write incomplete cells (cells having a threshold voltage over the verify level) and write complete cells (cells having a threshold voltage below the verify level) by a solid line, and show the entire distribution and the initial distribution by a dotted line.

As shown in the statuses A to E in FIG. 9, in the normal write operation, mountains (distribution) of the write incomplete cells gradually move right to mountains of the write complete cells. Finally, the threshold voltages of all memory cells exceed the verify level (VB and VC) (see the status E).

Meanwhile, as shown in the statuses B to E in FIG. 10, the abnormal write operation encounters a phenomenon (so-called "drop") in which a portion of the mountains of the write incomplete cells that have once passed the verify moves over time to the threshold voltage lower than the verify level. This results in a phenomenon in which when the write operation is completed, the threshold voltages of some of the memory cells fall below the verify levels (VB and VC). This phenomenon is particularly likely to occur in the C distribution (in "00" data writing) in which the threshold voltages move largely.

Therefore, in the first embodiment, a method of writing data to solve the relevant problem will be described below.

(Description of Data Write Operation)

Figure 11:
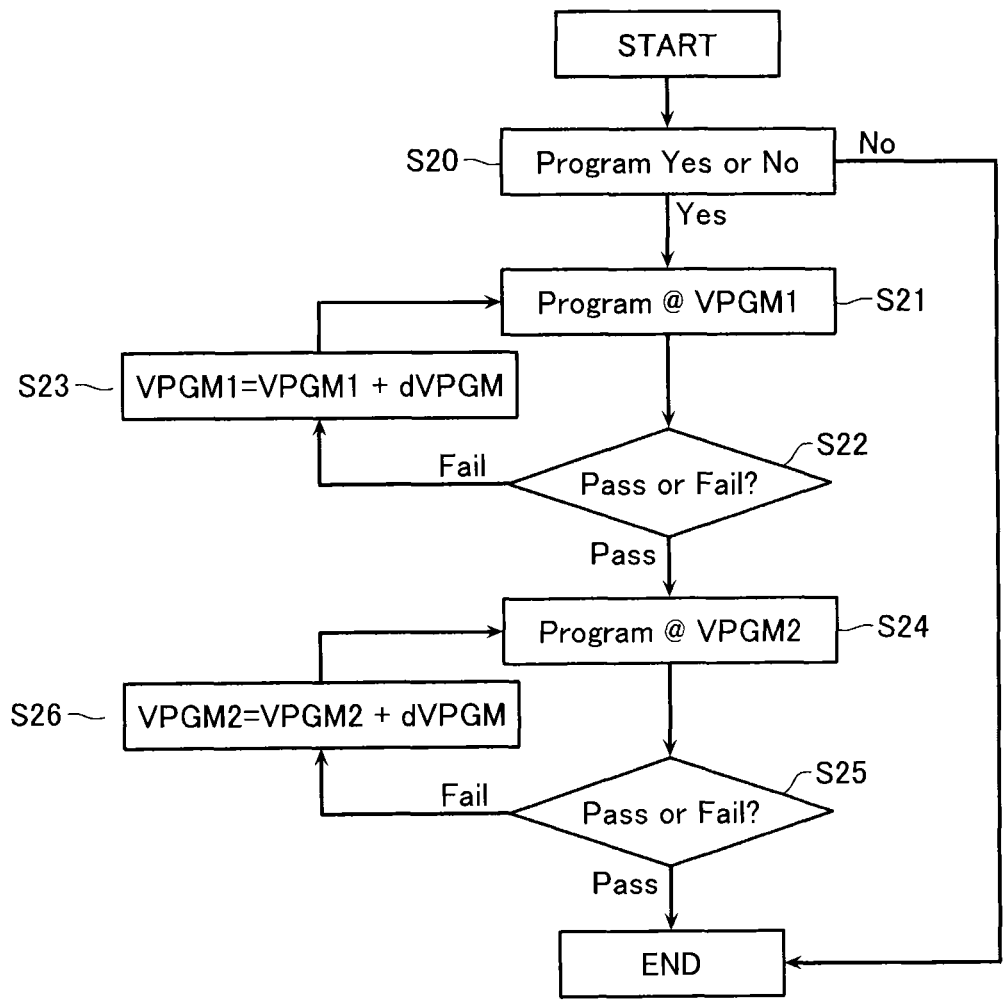
FIG. 11 is a flowchart of the data write operation of the semiconductor memory device according to the first embodiment.

FIG. 11 is a flowchart showing the data write operation of the semiconductor memory device according to the first embodiment. Similarly to the first comparative embodiment (FIG. 6), a description is given of the memory cell MC written with "00" data that provides the highest threshold voltage distribution (C).

First, the control circuit determines whether to perform the data write operation (program operation) (step S20). If step S20 determines "NO", then the write operation is completed.

If step S20 determines "YES", then the control circuit applies to the memory cell the first write voltage VPGM1 for writing the high voltage threshold distribution (C) corresponding to "00" data (step S21). Then, the control circuit performs the verify operation of determining whether the write operation is completed (step S22). If step S22 does not determine that the write operation is completed (step S22 =Fail), then the control circuit steps up the value of the first write voltage VPGM1 (step S23) and performs again the write operation in step S21. The new write voltage is, as shown in step S23, VPGM1=VPGM1+dVPGM. Hereinafter, the cycle from step S21 to step S23 is referred to as a first write operation.

If step S22 determines that the write operation is completed (step S22 =Pass), then the control circuit continues to perform the write operations in steps S24 to S26. First, the control circuit applies to the memory cell that has once passed the verify operation in step S22 the second write voltage VPGM2 for writing the threshold distributions (A and B) corresponding to data "01" and "10" (step S24). As shown in FIG. 5, the second write voltage VPGM2 is lower than the first write voltage VPGM1.

Then, the control circuit performs the verify operation of determining whether the write operation is completed (step S25). If step S25 does not determine that the write operation is completed (step S25=Fail), then the control circuit steps up the value of the second write voltage VPGM2 (step S26) and performs again the write operation in step S24. The new write voltage is, as shown in step S26, VPGM2=VPGM2++ dVPGM. If step S25 determines that the write operation is completed (step S25=Pass), then the control circuit completes the write operation. Hereinafter, the cycle from step S24 to step S26 is referred to as a second write operation.

Figure 12:
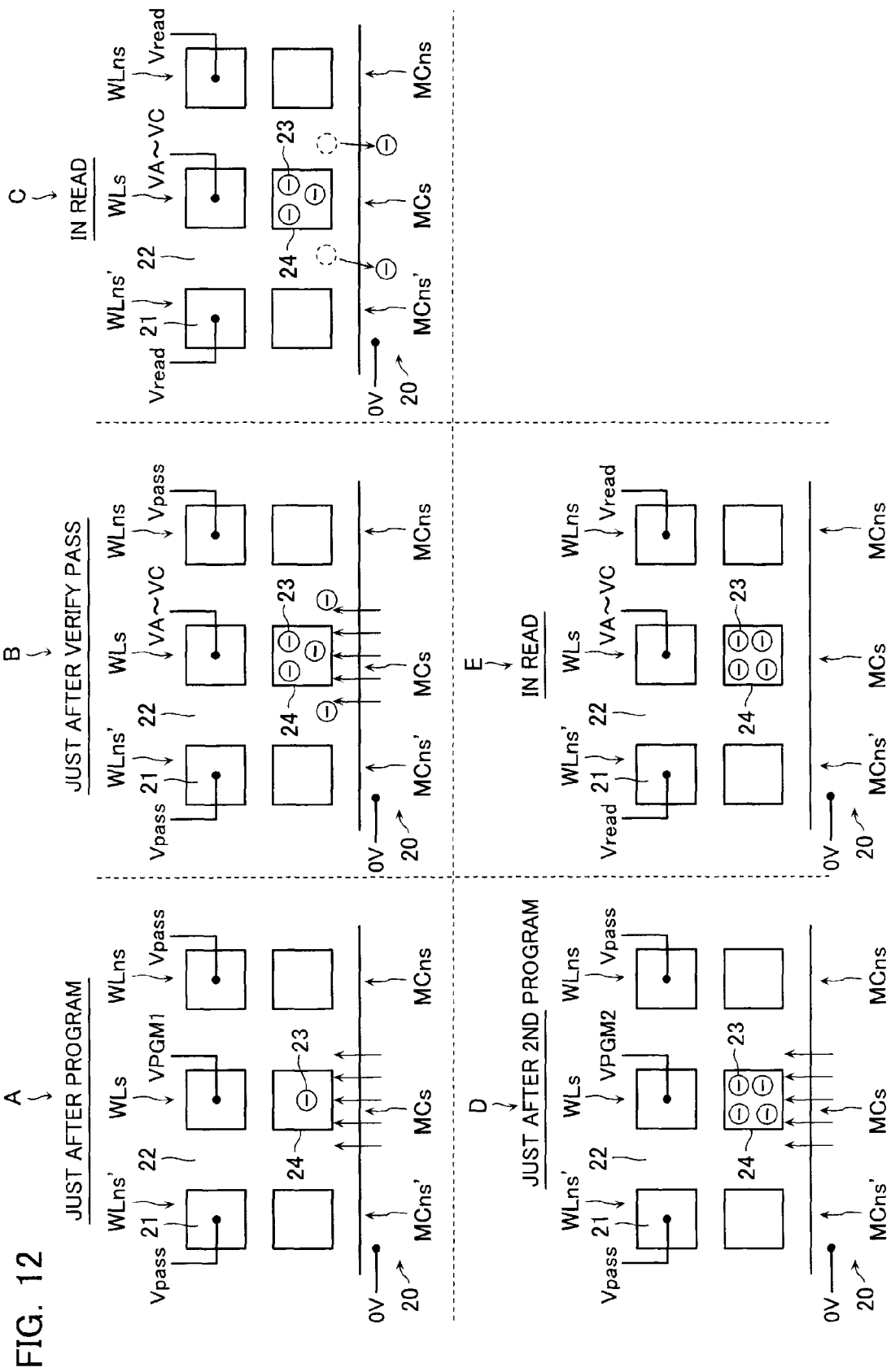
FIG. 12 is a schematic diagram showing memory cells in writing data to the semiconductor memory device according to the first embodiment.

FIG. 12 is a schematic diagram showing the memory cell in writing data to the semiconductor memory device according to the first embodiment. Detailed description is omitted here about the configuration corresponding to the comparative embodiments (FIG. 7 to FIG. 8). The status A in FIG. 12 corresponds to the first write operation in FIG. 11. Charge 23 is injected from the channel region 20 to the floating gate 24. However, as shown in the status B in FIG. 12, some of the charge 23 is trapped in the insulating film 22, and the presence of the relevant charge allows the selected memory cell MCs to pass the first verify operation (step S22 in FIG. 11). Then, as shown in the status C in FIG. 12, the charge 23 trapped in the insulating film 22 is leaked out over time. This reduces the threshold voltage of the selected memory cell MCs.

Here, if as shown in the Status D in FIG. 12, the second write operation is performed, the charge 23 trapped in the insulating film 22 moves to the floating gate 24 and also charge moves from the channel region 20 to the floating gate 24. Thus, as shown in the status E in FIG. 12, sufficient charge is accumulated in the floating gate 24, and thus the threshold voltage is less likely to decrease over time.

Figure 13:
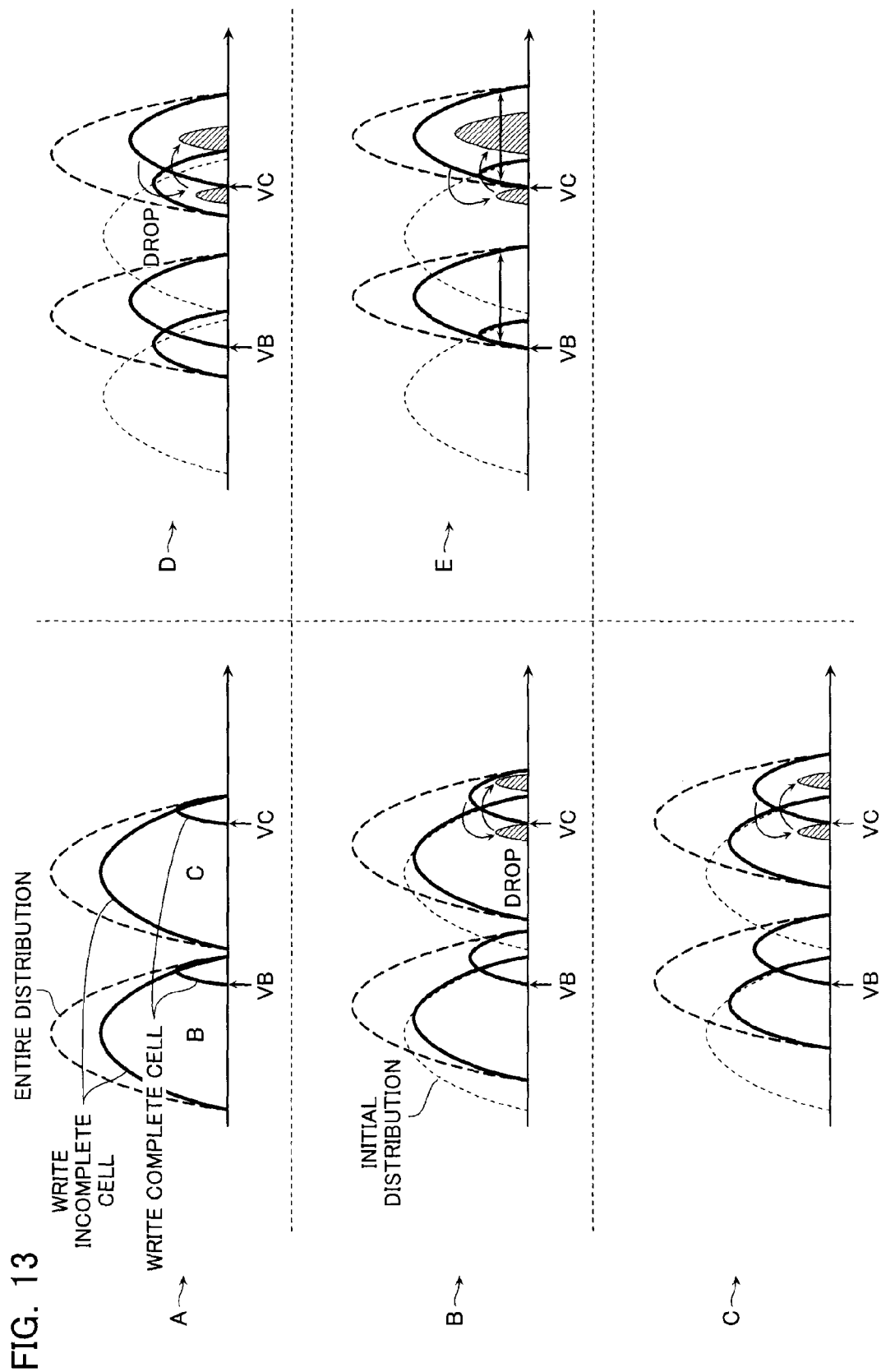
FIG. 13 is a graph showing a change of the threshold voltage distributions of the memory cells in writing data to the semiconductor memory device according to the first embodiment.

FIG. 13 is a graph showing the change of the threshold voltage distributions of the memory cells in writing data to the semiconductor memory device according to the first embodiment. Detailed description is omitted here about the configuration common to the comparative embodiments (FIG. 9 to FIG. 10). As shown in the statuses B to E in FIG. 13, even in the semiconductor memory device according to this embodiment, the first write operation encounters the "drop" phenomenon as in the comparative embodiment (FIG. 10). However, as shown in the statuses B to E in FIG. 13, in this embodiment, the first write operation is followed by the second write operation that restores the dropped distributions of the memory cells to voltage distributions higher than the verify threshold (VC). As a result, when the write operation is completed (see status E), all memory cells exceed the verify levels (VB and VC).

Figure 14:
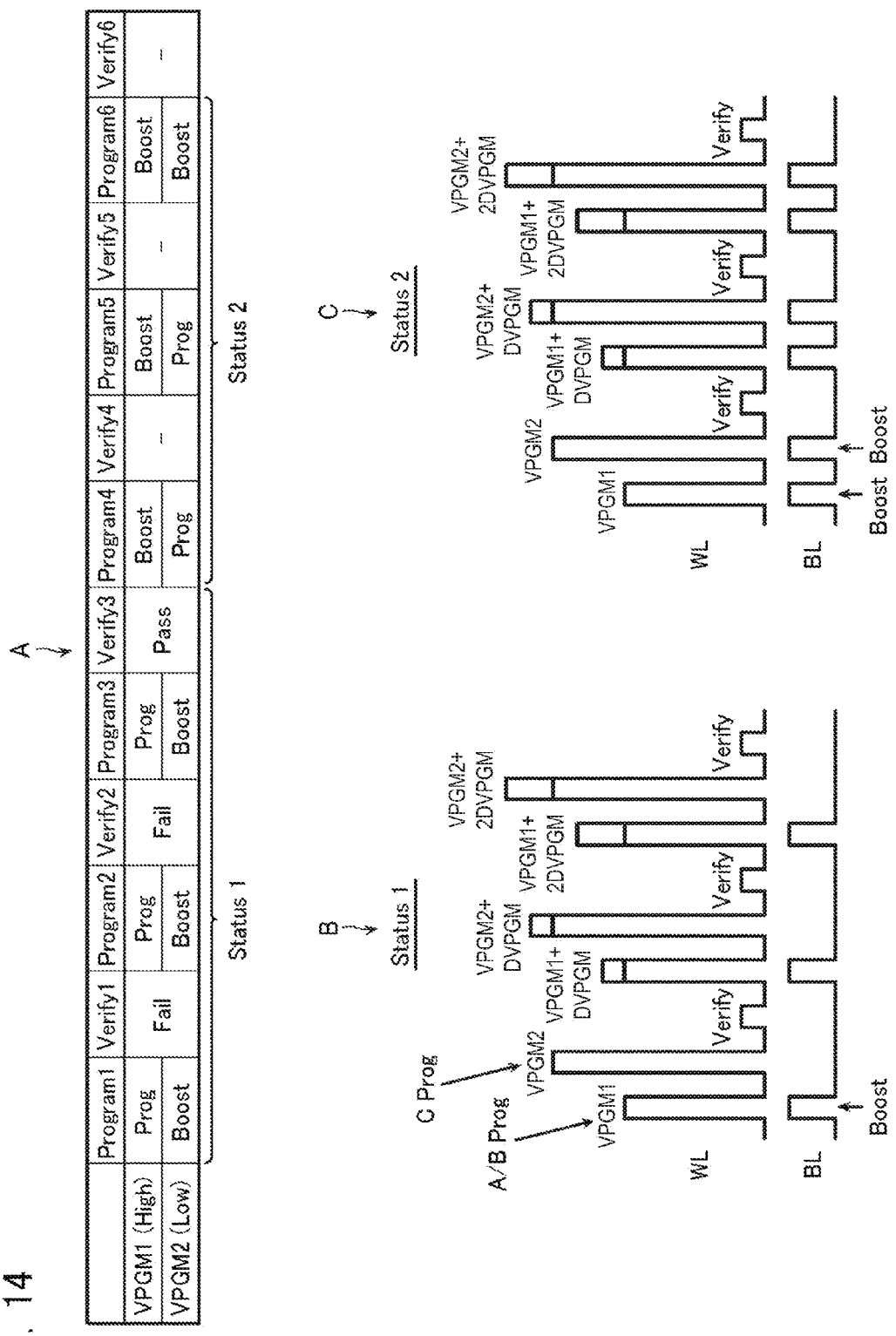
FIG. 14 is a schematic diagram illustrating the data write operation of the semiconductor memory device according to the first comparative embodiment.
Figure 15:
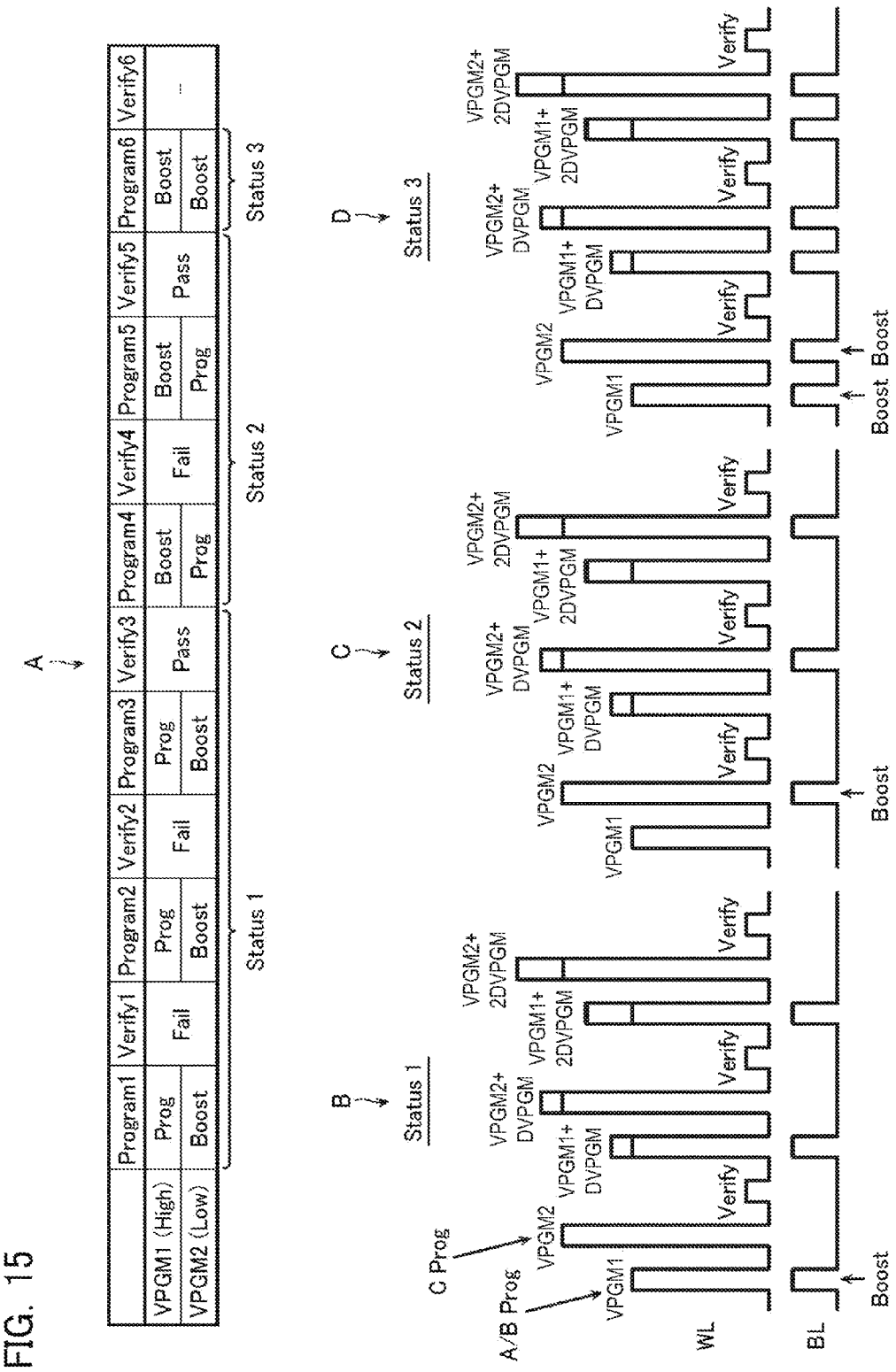
FIG. 15 is a schematic diagram illustrating the data write operation of the semiconductor memory device according to the first embodiment.

With reference to FIG. 14 and FIG. 15, specific examples of the write operation to a specific memory cell will be described. FIG. 14 is a schematic diagram for illustrating the data write operation of the semiconductor memory device according to the comparative embodiment. FIG. 14 shows the writing operation of data ("00") corresponding to the highest threshold voltage distribution (C). Sequence A in FIG. 14 corresponds to the sequence of the write operation to the memory cells. Sequence A shows the bit-line (BL) voltage when the word-line (WL) is applied with the first word-line voltage (VPGM1) or the second word-line voltage (VPGM2). Note that the voltage applied to the bit-lines BL is transferred via the selection gate to the channel region, and thus the bit-line voltage in the figure substantially shows the channel voltage.

In FIG. 14, one cycle is set as the combination of the write stage (Program) corresponding to step S11 and the verify stage (Verify) corresponding to step S12 in FIG. 6, and a total of six cycles of write operation is shown as sequence A. It is consumed here that the verify stage is passed in the 3rd write operation (Verify3=Pass). The above stages are referred to as a 1st stage (Status 1), and the subsequent stages are referred to as a 2nd stage (Status 2). In addition, FIG. 14 shows, with respect to the voltages applied to the word-line (WL) and the bit-lines (BL), the 1st stage (Status 1) as status B and the 2nd stage (Status 2) as status C.

As shown in status B, in the 1st stage (Status 1), the word-line WL is sequentially applied with "the second word-line voltage (VPGM2), the first word-line voltage (VPGM1), and the verify voltage (Verify)", as in FIG. 5. The first and second word-line voltages VPGM1 and VPGM2 are stepped up by DVPGM for each cycle.

Then, as shown in sequence A and status B, the bit-line BL (channel region) voltage is in the floating state (Boost) when the second word-line voltage VPGM2 is applied, and is at the first channel voltage Vss(=0 V) when the first write voltage VPGM1 is applied. As a result, in the 1st stage (status 1), the memory cells are applied only with the first write voltage VPGM1.

Next, as shown in status C, again in the 2nd stage (Status 2), the word-line WL is applied with the stepped-up voltage in the same order as in the 1st stage. Meanwhile, the voltage of the bit-lines BL (channel region) is floated (Boost) both when the first write voltage VPGM1 is applied and when the second write voltage VPGM2 is applied. As a result, in the 2nd stage (Status 2), the memory cells are not applied with the first write voltage VPGM1 or the second write voltage VPGM2.

FIG. 15 is a schematic diagram for illustrating the data write operation of the semiconductor memory device according to the first embodiment. FIG. 15 shows the writing operation of data ("00") corresponding to the highest threshold voltage distribution (C). Detailed description is omitted here about the components common to FIG. 14. FIG. 15 shows, with respect to the voltages applied to the word-line (WL) and the bit-lines (BL), the 1st stage (Status 1) as status B, the 2nd stage (Status 1) as status C, and the 3rd stage (Status 1) as Status D.

FIG. 15 shows, as in sequence A, the 1st to 3rd cycles as the 1st stage (Status 1), the 4th to 5th cycles as the 2nd stage (Status 2), and the 6th cycle as the 3rd stage (Status 3). The 1st stage (Status 1) corresponds to the first write operation (steps S21 to S23 in FIG. 11) in this embodiment. The 2nd stage (Status 2) corresponds to the second write operation (steps S24 to S26 in FIG. 11) in this embodiment. The status B in the 1st stage (Status 1) and the status D in the 3rd stage (Status 3) are similar to those in the 1st stage (Status 1) and the 2nd stage (Status 2) in the comparative embodiment (FIG. 14), respectively. Thus their detailed description is omitted here.

FIG. 15 shows, as in status C, that the voltage of the bit-lines BL (channel region) in the 2nd stage (Status 2) is in the floating state (Boost) when the first write voltage VPGM1 is applied and is the first channel voltage Vss(=0 V) when the second write voltage VPGM2 is applied. As a result, in the 2nd stage (Status 2), the memory cells are applied only with the second write voltage VPGM2.

As described above, in the semiconductor memory device according to this embodiment, the selected memory cell MCs that has completed the first write operation with the first write voltage VPGM1 is subjected to the second write operation with the second write voltage VPGM2. Thus, sufficient charge 23 may be accumulated in the floating gate 24 (see status E in FIG. 12) to reduce the threshold voltage "drop" over time and improve the data hold characteristics. Then, the second write operation may comprise the second write voltage VPGM2 lower than the first write voltage VPGM1 to reduce excessive increase of the threshold voltage of the memory cells.

In addition, in the semiconductor memory device according to this embodiment, the control circuit performs, immediately after the verify operation (see step S22 in FIG. 11) of determining whether the first write operation is completed, the second write operation. As described above, without rechecking for the phenomenon of the threshold voltage drop over time, all memory cells may be uniformly subjected to the second write operation, thus reducing the write time.

In addition, the semiconductor memory device according to this embodiment comprises, as the second write voltage, the voltage (VPGM2) for writing the threshold distributions (A and B) lower than the threshold distribution (C) written by the first write voltage. Thus, the second write operation need not have a new voltage generated for it, which may simplify the circuitry.

Note that in this embodiment, as shown in FIG. 14, when the word-line WL is applied with the second word-line voltage VPGM2 in the 1st stage (Status 1), the voltage of the channel region is set in the floating state (Boost) and the memory cells are set in the non-selected state. However, the memory cells may not be in the non-selected state but in the selected state by, for example, applying to the channel region the first channel voltage Vss(=0 V). In this case, the memory cells are applied with the second write voltage VPGM2, thus increasing the threshold voltage. However, no problems will arise if the combination with the increased threshold voltage by the application of the first write voltage VPGM1 is within a range of the desired threshold voltage distribution.

Second Embodiment

In a second embodiment, a description is given of one type of write voltage being applied to the word-line WL. First, a second comparative embodiment to be compared with will be described, and then the second embodiment will be described.

Figure 16:
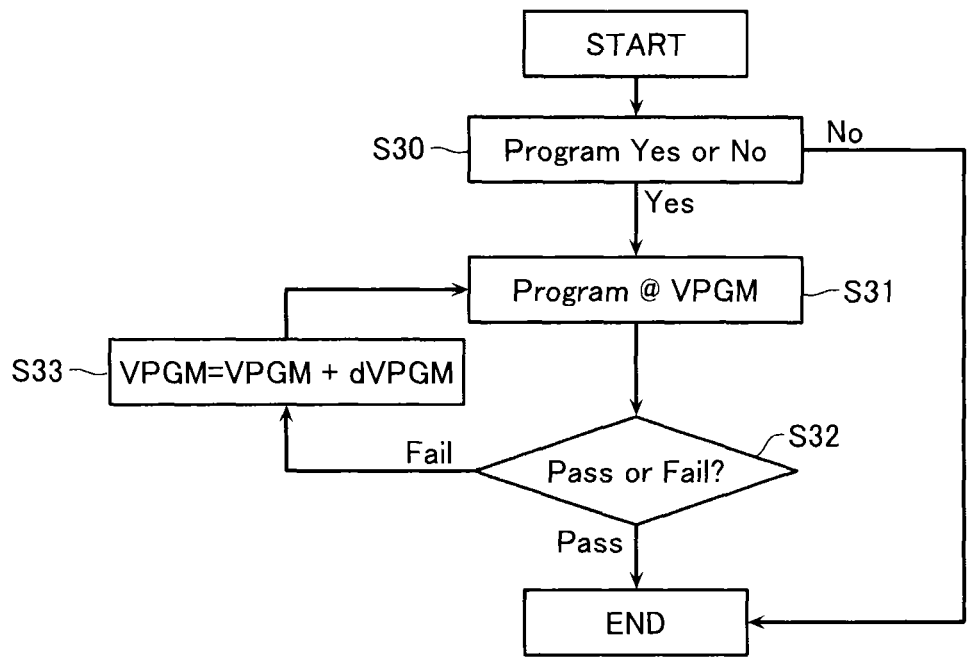
FIG. 16 is a flowchart showing a data write operation of a semiconductor memory device according to a second comparative embodiment.

FIG. 16 is a flowchart showing the data write operation of the semiconductor memory device according to the second comparative embodiment. Here, unlike the first embodiment, the write voltage (word-line voltage) applied to the word-line is only one type of voltage (VPGM). First, the control circuit comprising the column control circuit 2 and the row control circuit 3 (see FIG. 1 for both) determines whether to perform the data write operation (program operation) (step S30). If step S30 determines "NO", then the write operation is completed.

If step S30 determines "YES", then the control circuit applies to the memory cells the write voltage VPGM (step S31). Then, the control circuit performs a verify operation to determine whether the write operation is completed (step S32). If step S32 determines that the write operation is completed (step S32=Pass), the control circuit completes the write operation. If step S32 does not determine that the write operation is completed (step S32=Fail), then the control circuit steps up the value of the write voltage VPGM (step S33) and performs again the write operation in step S31. The new write voltage is, as shown in step S33, VPGM=VPGM+dVPGM.

Figure 17:
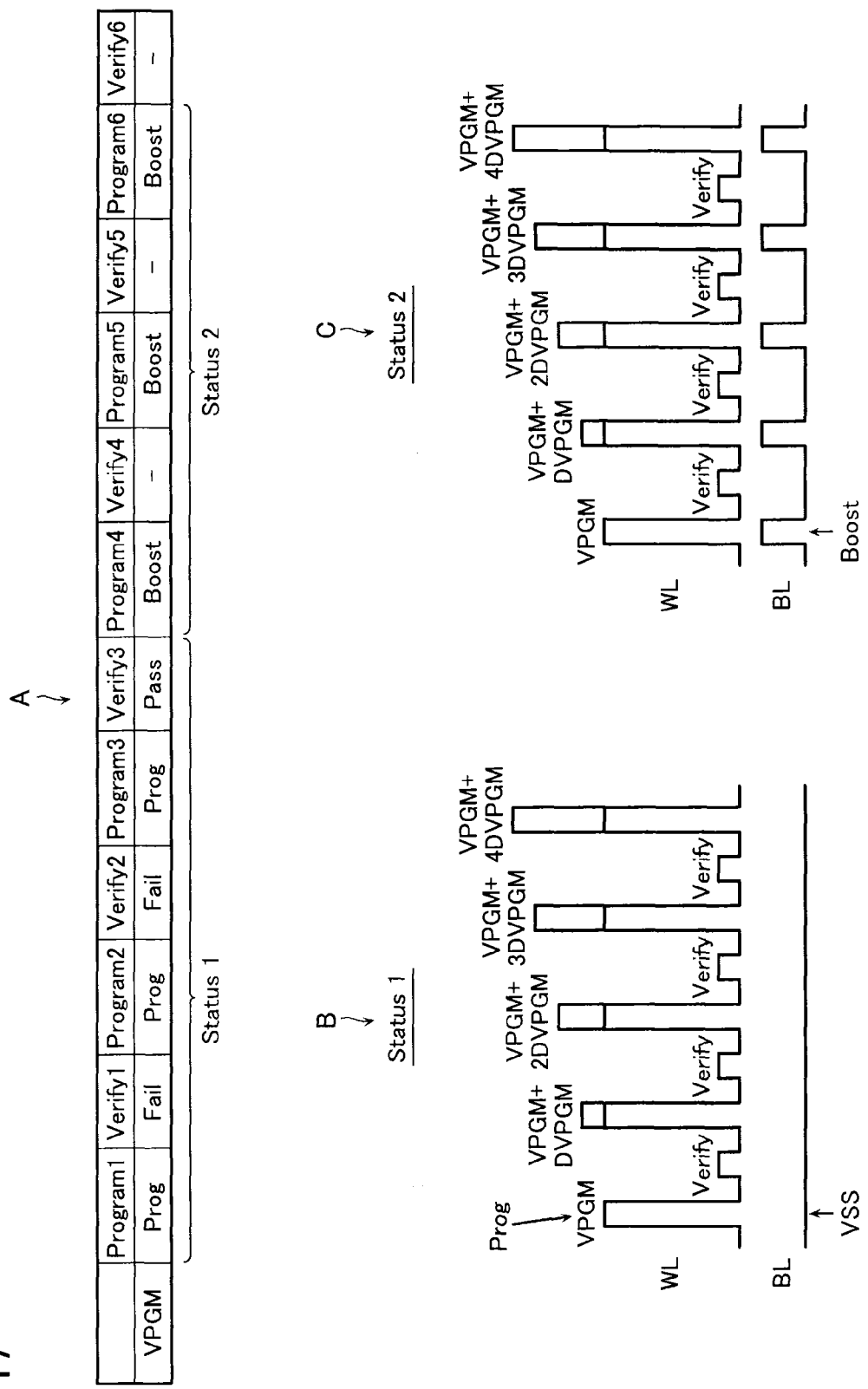
FIG. 17 is a schematic diagram illustrating the data write operation of the semiconductor memory device according to the second comparative embodiment.

FIG. 17 is a schematic diagram for illustrating the data write operation of the semiconductor memory device according to the second comparative embodiment. FIG. 17 corresponds to FIG. 14 and FIG. 15 described with respect to the first embodiment. Therefore, detailed description is omitted here about the components common to both embodiments.

FIG. 17 shows, as in sequence A, the 1st to 3rd cycles as the 1st stage (Status 1), and the 4th to 6th cycles as the 2nd stage (Status 2). The 1st stage (Status 1) corresponds to the write operation (steps S31 to S33 in FIG. 16) in the second comparative embodiment.

FIG. 17 shows, as in status B, that in the 1st stage (Status 1), the word-line WL is sequentially applied with the word-line voltage (VPGM) and the verify voltage (Verify). The word-line voltage VPGM is stepped up by DVPGM for each cycle. Then, as shown in sequence A and status B, the voltage of the bit-line BL (channel region) is the first channel voltage Vss(=0 V) when the word-line voltage VPGM is applied. As a result, in the 1st stage (Status 1), the memory cells are applied with the write voltage VPGM for writing data.

Next, as shown in status C, again in the 2nd stage (Status 1), the word-line WL is applied with the stepped-up voltage in the same order as in the 1st stage, but the voltage of the bit-lines BL (channel region) is floated (Boost). As a result, in the 2nd stage (Status 2), the memory cells are not applied with the write voltage VPGM. In this case, as in the first comparative embodiment, the phenomenon of the threshold voltage "drop" may occur over time.

Figure 18:
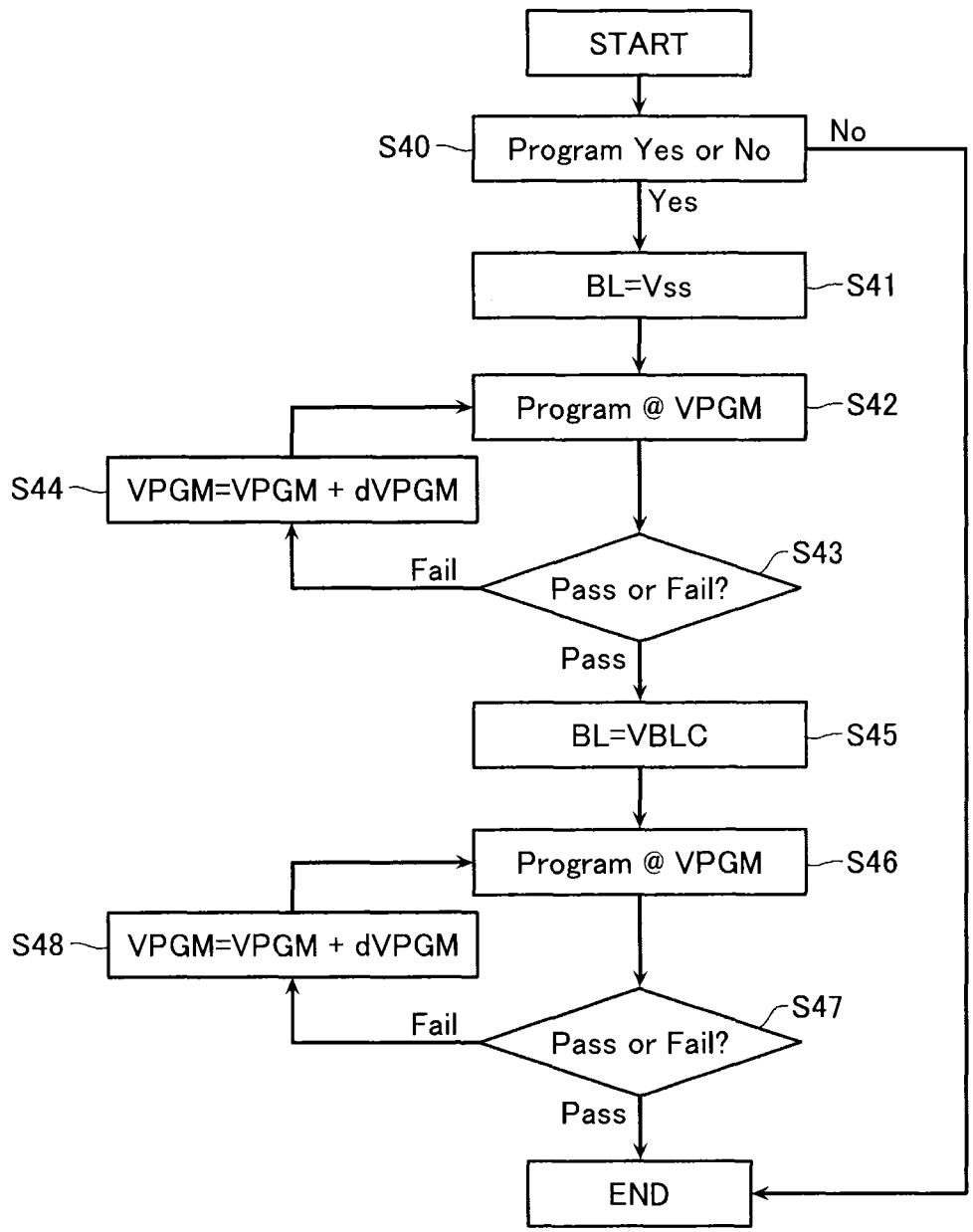
FIG. 18 is a flowchart of a data write operation of a semiconductor memory device according to a second embodiment.

FIG. 18 is a flowchart showing the data write operation of the semiconductor memory device according to the second embodiment. First, the control circuit determines whether to perform the data write operation (program operation) (step S40). If step S40 determines "NO", then the write operation is completed.

If step S40 determines "YES", then the control circuit sets the bit-line voltage to the first channel voltage (BL=VSS) and applies to the memory cells the write voltage VPGM (step S42). Then, the control circuit performs the verify operation to determine whether the write operation is completed (step S43). If step S42 does not determine that the write operation is completed (step S43=Fail), then the control circuit steps up the value of the write voltage VPGM (step S44) and performs again the write operation in step S42. The new write voltage is, as shown in step S44, VPGM=VPGM+dVPGM. Hereinafter, the cycle from step S42 to step S44 is referred to as the first write operation.

If step S43 determines that the write operation is completed (step S43=Pass), then the control circuit sets the bit-line voltage to the second channel voltage (BL=VBL) higher than the first channel voltage and continues to perform the write operation in steps S46 to S48.

First, the control circuit applies the write voltage VPGM (step S46) again to the memory cells that has once passed the verify operation in step S43. The value of the write voltage is the same as that in the first write operation in step S42. However, because the bit-line voltage is VBL, the effective voltage applied to the memory cells is "VPGM−VBL" that is lower than the voltage in the first write operation. Hereinafter, the effective voltage applied to the memory cells in the first write operation is referred to as the first write voltage (VPGM), and the effective voltage applied to the memory cells in the second write operation is referred to as the second write voltage (VPGM−VBL).

Then, the control circuit performs the verify operation to determine whether the write operation is completed (step S47). If step S47 does not determine that the write operation is completed (step S47=Fail), then the control circuit steps up the value of the write voltage VPGM (step S48) and performs again the write operation in step S46. The new write voltage is, as shown in step S48, VPGM=VPGM+dVPGM. If step S47 determines that the write operation is completed (step S47=Pass), then the control circuit completes the write operation. Hereinafter, the cycle from step S46 to step S48 is referred to as the second write operation.

Figure 19:
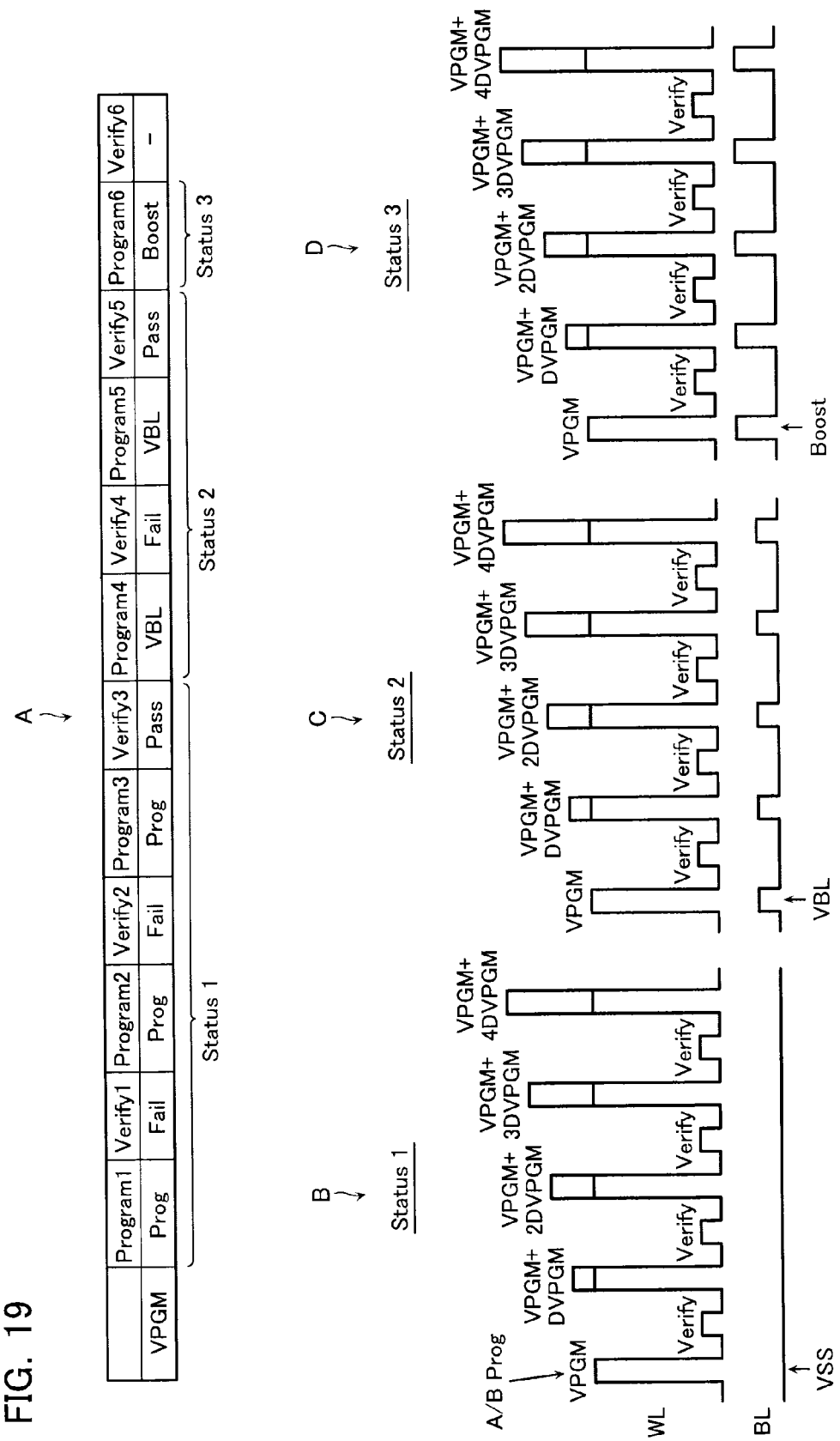
FIG. 19 is a schematic diagram illustrating the data write operation of the semiconductor memory device according to the second embodiment.

FIG. 19 is a schematic diagram for illustrating the data write operation in the semiconductor memory device according to the second embodiment. Detailed description is omitted here about the components common to FIG. 17.

FIG. 19 shows, as in sequence A, the 1st to 3rd cycles as the 1st stage (Status 1), the 4th to 5th cycles as the 2nd stage (Status 2), and the 6th cycle as the 3rd stage (Status 3). The 1st stage (Status 1) corresponds to the first write operation (steps S42 to S44 in FIG. 18) in this embodiment. The 2nd stage (Status 2) corresponds to the second write operation (steps S46 to S48 in FIG. 18) in this embodiment. The status B in the 1st stage (Status 1) and the status D in the 3rd stage (Status 3) are similar to those in the 1st stage (Status 1) and the 2nd stage (Status 2) in the comparative embodiment (FIG. 17), respectively. Thus, their detailed description is omitted here.

FIG. 19 shows, as in status C, that the voltage of the bit-lines BL (channel region) in the 2nd stage (Status 2) is VBL that is higher than Vss in the 1st stage (Status 1) and lower than Boost voltage in the 3rd stage (Status 3). As a result, in the 2nd stage (Status 2), the memory cells are applied with the second write voltage (VPGM−VBL).

As described above, in the semiconductor memory device according to the second embodiment, even if the word-line WL is applied with one type of write voltage, the bit-lines BL may be applied with two types of voltages (channel voltage) to generate the different first and second write voltages. Then, the memory cell that has completed the first write operation with the first write voltage may be subjected to the second write operation with the second write voltage, thus reducing the threshold voltage "drop" over time and improving the data hold characteristics, as in the first embodiment.

Here, the second channel voltage VBL may comprise the so-called quick pass write voltage ($V_{qpw}$). This voltage is described in, for example, Japanese published unexamined application No. 2003-196988. In addition, the second embodiment is not limited to, unlike the first embodiment, a memory cell having three types or more of threshold voltage distributions, and is applicable to a memory cell having two types of threshold voltage distributions.

In addition, the second embodiment may be combined with the first embodiment. For example, if data "10" is written that corresponds to the second highest threshold voltage distribution (see the distribution B in FIG. 4), the first write operation is performed with the word-line voltage of VPGM2 and the bit-line voltage of Vss. Then, the second write operation is performed with the same word-line voltage of VPGM2 and the bit-line voltage of VBL. As a result, in the first write operation, the effective voltage (the first write voltage) applied to the memory cell is VPGM2, and in the second write operation, the effective voltage (the second write voltage) applied to the memory cell is VPGM2−VBL. As described above, even if the memory cells are written with other than the highest threshold voltage distribution, they may be subjected to both of the first and second write operations, thus reducing the threshold voltage "drop" over time and improving the data storage characteristics.

Other Embodiments

Thus, some embodiments of the present invention have been described, but these embodiments are shown by way of example and are not intended to limit the scope of the invention. These novel embodiments may be embodied in a variety of other forms, and various omissions, substitutions, and changes may be made without departing from the spirit of the invention. These embodiments and variants thereof are within the scope and sprit of the invention, and are also within the scope of the invention as defined in the appended claims and the equivalents thereof.

What is claimed is:

1. A semiconductor memory device comprising:
   a memory cell array comprising memory cells, each memory cell being able to store multi-bit data;
   word-lines connected to the memory cells, the word-lines being arranged in a first direction;
   bit-lines arranged in a second direction crossing the first direction, the bit-lines reading data from the memory cell array; and
   a control circuit controlling the operation of the memory cell array,
   the control circuit performs
   a first write operation of applying a first write voltage between a selected word-line and a channel of a selected memory cell,
   then, performs a verify operation of determining whether the first write operation is completed, and
   performs a second write operation of applying, if the write operation to the first threshold voltage is completed in the verify operation, a second write voltage lower than the first write voltage between the selected word-line and the channel.

2. The semiconductor memory device according to claim 1, wherein
   in the first write operation, the control circuit sequentially applies a first word-line voltage and a second word-line voltage to the selected word-line, and if the first word-line voltage is applied, sets the channel of the selected memory cell to a first channel voltage, thus applying the first write voltage corresponding to the difference between the first word-line voltage and the first channel voltage to the selected memory cell, and
   in the second write operation, the control circuit sequentially applies the first word-line voltage and the second word-line voltage to the selected word-line, and if the first word-line voltage is applied, sets the channel of the selected memory cell in a floating state, and if the second word-line voltage is applied, sets the channel of the selected memory cell to the first channel voltage, thus applying the second write voltage corresponding to the difference between the second word-line voltage and the first channel voltage to the selected memory.

3. The semiconductor memory device according to claim 2, wherein
   in the first write operation, the control circuit sets, if the second word-line voltage is applied, the channel of the selected memory cell in a floating state.

4. The semiconductor memory device according to claim 1, wherein
   in the first write operation, the control circuit applies the first word-line voltage to the selected word-line and sets the channel of the selected memory cell to a first channel voltage, thus applying the first write voltage corresponding to the difference between the first word-line voltage and the first channel voltage to the selected memory cell, and
   in the second write operation, the control circuit applies the first word-line voltage to the selected word-line and sets the channel of the selected memory cell to a second channel voltage higher than the first channel voltage, thus applying the second write voltage corresponding to the difference between the first word-line voltage and the second channel voltage to the selected memory cell.

5. The semiconductor memory device according to claim 1, wherein
   the memory cell can store three or more valued data, and the second write voltage is used to write a second threshold voltage lower than the first threshold voltage to the selected memory cell.

6. The semiconductor memory device according to claim 1, wherein
   the control circuit performs, immediately after the verify operation determines that the first write operation is completed, the second write operation.

7. A method of controlling a semiconductor memory device, the semiconductor memory device comprising:
   a memory cell array comprising memory cells, each memory cell being able to store multi-bit data;
   word-lines connected to the memory cells, the word-lines being arranged in a first direction;
   bit-lines arranged in a second direction crossing the first direction, each bit-line reading data from the memory cell array; and
   a control circuit controlling the operation of the memory cell array,
   the method comprising:
   performing a first write operation of applying a first write voltage between a selected word-line and a channel of a selected memory cell;
   then performing a verify operation of determining whether the first write operation is completed; and
   performing, if the verify operation determines that the write operation to the first threshold voltage is completed, a second write operation applying a second write voltage lower than the first write voltage between the selected word-line and the channel.

8. The method of controlling a semiconductor memory device according to claim 7,
   in the first write operation, a first word-line voltage and a second word-line voltage are sequentially applied to the selected word-line, and if the first word-line voltage is applied, the channel of the selected memory cell is set to a first channel voltage, thus applying the first write voltage corresponding to the difference between the first word-line voltage and the first channel voltage to the selected memory cell and
   in the second write operation, the first word-line voltage and the second word-line voltage are sequentially applied to the selected word-line, and if the first word-line voltage is applied, the channel of the selected memory cell is set in a floating state, and if the second word-line voltage is applied, the channel of the selected memory cell is set to the first channel voltage, thus applying the second write voltage corresponding to the difference between the second word-line voltage and the first channel voltage to the selected memory cell.

9. The method of controlling a semiconductor memory device according to claim 8, wherein
   in the first write operation, if the second word-line voltage is applied, the channel of the selected memory cell is set in a floating state.

10. The method of controlling a semiconductor memory device according to claim 7, wherein
    in the first write operation, the first word-line voltage is applied to the selected word-line and the channel of the selected memory cell is set to a first channel voltage, thus applying the first write voltage corresponding to the difference between the first word-line voltage and the first channel voltage to the selected memory cell, and in the second write operation, the first word-line voltage is applied to the selected word-line and the channel of the selected memory cell is set to a second channel voltage higher than the first channel voltage, thus applying the second write voltage corresponding to the difference between the first word-line voltage and the second channel voltage to the selected memory cell.

11. The method of controlling a semiconductor memory device according to claim 7, wherein the memory cell can store three or more valued data, and the second write voltage is used to write a second threshold voltage lower than the first threshold voltage to the selected memory cell.

12. The method of controlling a semiconductor memory device according to claim 7, wherein the second write operation is performed immediately after the verify operation determines that the first write operation is completed.

13. A semiconductor memory device comprising:

a memory cell array comprising memory cells, each memory cell being able to store multi-bit data;

word-lines connected to the memory cells, the word-lines being arranged in a first direction;

bit-lines arranged in a second direction crossing the first direction, the bit-lines reading data from the memory cell array; and a control circuit controlling the operation of the memory cell array, the control circuit performs a first write operation of applying a first write voltage between a selected word-line and a channel of a selected memory cell, and performs a second write operation of applying, if the write operation to the first threshold voltage is completed, a second write voltage lower than the first write voltage between the selected word-line and the channel.

14. The semiconductor memory device according to claim 13, wherein in the first write operation, the control circuit sequentially applies a first word-line voltage and a second word-line voltage to the selected word-line, and if the first word-line voltage is applied, sets the channel of the selected memory cell to a first channel voltage, thus applying the first write voltage corresponding to the difference between the first word-line voltage and the first channel voltage to the selected memory cell, and in the second write operation, the control circuit sequentially applies the first word-line voltage and the second word-line voltage to the selected word-line, and if the first word-line voltage is applied, sets the channel of the selected memory cell in a floating state, and if the second word-line voltage is applied, sets the channel of the selected memory cell to the first channel voltage, thus applying the second write voltage corresponding to the difference between the second word-line voltage and the first channel voltage to the selected memory.

15. The semiconductor memory device according to claim 14, wherein in the first write operation, the control circuit sets, if the second word-line voltage is applied, the channel of the selected memory cell in a floating state.

16. The semiconductor memory device according to claim 13, wherein in the first write operation, the control circuit applies the first word-line voltage to the selected word-line and sets the channel of the selected memory cell to a first channel voltage, thus applying the first write voltage corresponding to the difference between the first word-line voltage and the first channel voltage to the selected memory cell, and in the second write operation, the control circuit applies the first word-line voltage to the selected word-line and sets the channel of the selected memory cell to a second channel voltage higher than the first channel voltage, thus applying the second write voltage corresponding to the difference between the first word-line voltage and the second channel voltage to the selected memory cell.

17. The semiconductor memory device according to claim 13, wherein the memory cell can store three or more valued data, and the second write voltage is used to write a second threshold voltage lower than the first threshold voltage to the selected memory cell.

\* \* \* \* \*